United States Patent
Liu et al.

(10) Patent No.: US 9,533,876 B2
(45) Date of Patent: Jan. 3, 2017

(54) MEMS STRUCTURES AND METHODS FOR FORMING THE SAME

(71) Applicant: Taiwan Semiconductor Manufacturing Company, Ltd., Hsin-Chu (TW)

(72) Inventors: Ping-Yin Liu, Yonghe (TW); Xin-Hua Huang, Xihu Township (TW); Hsin-Ting Huang, Bade (TW); Yuan-Chih Hsieh, Hsin-Chu (TW); Jung-Huei Peng, Jhubei (TW); Lan-Lin Chao, Sindian (TW); Chia-Shiung Tsai, Hsin-Chu (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/731,823

(22) Filed: Jun. 5, 2015

(65) Prior Publication Data
US 2015/0266722 A1    Sep. 24, 2015

Related U.S. Application Data

(62) Division of application No. 13/280,075, filed on Oct. 24, 2011, now Pat. No. 9,054,121.

(51) Int. Cl.
| | | |
|---|---|---|
| H01L 29/84 | (2006.01) | |
| B81B 7/00 | (2006.01) | |
| H01L 49/02 | (2006.01) | |
| B81C 1/00 | (2006.01) | |
| H01G 5/16 | (2006.01) | |
| B81B 3/00 | (2006.01) | |

(52) U.S. Cl.
CPC .......... *B81B 7/0058* (2013.01); *B81B 3/0005* (2013.01); *B81B 3/0021* (2013.01); *B81C 1/00269* (2013.01); *B81C 1/00793* (2013.01); *H01G 5/16* (2013.01); *H01L 28/60* (2013.01); *B81C 2201/053* (2013.01); *B81C 2203/0109* (2013.01)

(58) Field of Classification Search
CPC ..................... H01L 2224/8336; H01L 28/60
USPC .......................................................... 257/415
See application file for complete search history.

(56) References Cited

U.S. PATENT DOCUMENTS

| | | |
|---|---|---|
| 5,602,671 A | 2/1997 | Hornbeck |
| 7,919,006 B2 | 4/2011 | Park |
| 2012/0115305 A1 | 5/2012 | Peng |
| 2013/0082338 A1* | 4/2013 | Pan .................. B81B 3/001 257/415 |

* cited by examiner

*Primary Examiner* — Douglas Menz
(74) *Attorney, Agent, or Firm* — Slater Matsil, LLP

(57) ABSTRACT

A method includes forming a MEMS device, forming a bond layer adjacent the MEMS device, and forming a protection layer over the bond layer. The steps of forming the bond layer and the protection layer include in-situ deposition of the bond layer and the protection layer.

20 Claims, 5 Drawing Sheets

MEMS STRUCTURES AND METHODS FOR FORMING THE SAME

PRIORITY CLAIM AND CROSS-REFERENCE

This application is a divisional of U.S. patent application Ser. No. 13/280,075, entitled "MEMS Structures and Methods for Forming the Same," filed on Oct. 24, 2011, which application is incorporated herein by reference.

BACKGROUND

Micro-electro-mechanical system (MEMS) devices may be used in various applications such as micro-phones, accelerometers, inkjet printers, etc. A commonly used type of MEMS devices includes a MEMS capacitor that has a movable element as a capacitor plate, and a fixed element as the other capacitor plate. The movement of the movable element causes the change in the capacitance of the capacitor. The change in the capacitance may be converted into the change in an electrical signal, and hence the MEMS device may be used as a micro-phone, an accelerometer, or the like. The movement of the movable element may also be used in an inkjet printer for squeezing the ink.

MEMS devices typically require a cap capping the MEMS devices for protection purpose. The bonding may be performed through eutectic bonding. However, the bonded surface may have an oxide layer that adversely affects the reliability of the bonding, and the oxide layer needs to be removed before bonding.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A micro-electro-mechanical system (MEMS) device and the method of forming the same are provided in accordance with various embodiments. The intermediate stages of forming the MEMS device are illustrated. The variations of the embodiments are discussed. Throughout the various views and illustrative embodiments, like reference numbers are used to designate like elements.

Figure 1:
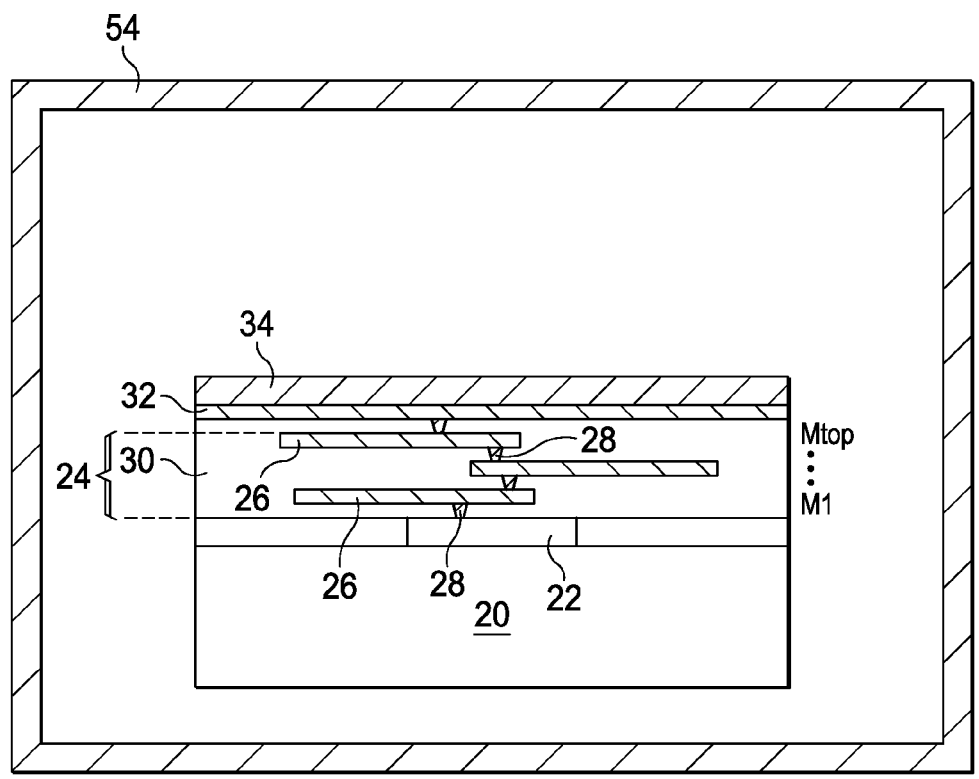
FIGS. 1 through 6 are cross-sectional views of intermediate stages in the manufacturing of a micro-electro-mechanical system (MEMS) device in accordance with various embodiments.

FIGS. 1 through 6 illustrate cross-sectional views of intermediate stages in the formation of a MEMS device in accordance with some embodiment. Referring to FIG. 1, substrate 20 is provided. In some embodiments, substrate 20 is a semiconductor substrate such as a silicon substrate, although other semiconductor materials such as silicon germanium, silicon carbon, III-V compound materials, and the like may be used.

Active devices 22 such as complementary metal-oxide-semiconductor (CMOS) devices may be formed on a surface of semiconductor substrate 20. Metal layers 24, which include metal lines 26 and vias 28 formed in dielectric layers 30, are formed over substrate 20 and active devices 22. Active devices 22 are electrically coupled to metal lines 26 and vias 28 in metal layers 24. Metal layers 24 include bottom metal layer M1 through top metal layer Mtop, wherein the symbol "top" represents the number of the topmost metal layer, which may be 3, 4, 5, or the like. In some embodiments, metal layers M1 through Mtop are formed of copper using damascene processes.

Metal layer 32 is formed over metal layers 24, and may be, or may not be, electrically coupled to metal lines 26 and vias 28. Metal layer 32 may be a blanket layer formed of aluminum, tin, aluminum copper, silicon-containing aluminum copper, or the like. Metal layer 32 may be deposited over metal layers 24, for example, using physical vapor deposition (PVD). The deposition step of metal layer 32 is performed in vacuumed chamber 54. In an exemplary embodiment, the volume percentages of aluminum and copper in the aluminum copper in metal layer 32 are about 99.5 percent and about 0.5 percent, respectively. In other exemplary embodiments, the volume percentages of aluminum, silicon, and copper in the silicon-containing aluminum copper in metal layer 32 are about 97.5 percent, about 2 percent, and about 0.5 percent, respectively.

FIG. 1 further illustrates the in-situ formation of blanket protection layer 34, which may be formed in-situ with the formation of metal layer 32. In some exemplary embodiments, the deposition step of protection layer 34 is performed in the same vacuumed chamber 54 for depositing metal layer 32. Between the step of forming metal layer 32 and the step of forming blanket protection layer 34, there may not be any vacuum break. Accordingly, no oxide is formed on the top surface of metal layer 32. In an exemplary embodiment, protection layer 34 is formed using PVD.

Protection layer 34 may be a substantially pure germanium layer, indium layer, gold layer, or tin layer. Alternatively, protection layer 34 may comprise germanium, indium, gold, tin, or alloys thereof. In yet other embodiments, protection layer 34 may be a composition layer including two or more of a germanium layer, a indium layer, a gold layer, and a tin layer that are stacked, and the stacked layers may be repeated. For example, protection layer 52 may comprise the stacked layers of Ge/Al, which may be repeated to form Ge/Al/Ge/Al/Ge layers. The materials of protection layer 34 are capable of forming a eutectic alloy with the material of metal layer 32 and the overlying bond layer 66 (not shown in FIG. 1, please refer to FIG. 5). Accordingly, the material of blanket protection layer 34 may be selected accordingly to the material of metal layer 32. For example, in the embodiments wherein metal layer comprises aluminum, the material of protection layer 34 may be selected from germanium, indium, gold, or combinations thereof. Alternatively, in the embodiments wherein metal layer 32 comprises tin, protection layer 34 may comprise gold. The thickness of protection layer 34 may be less than about 500 A to ensure a reliable bonding (as shown in FIG. 6), and at the same time no squeezing of the molten eutectic metal occurs.

Figure 2:
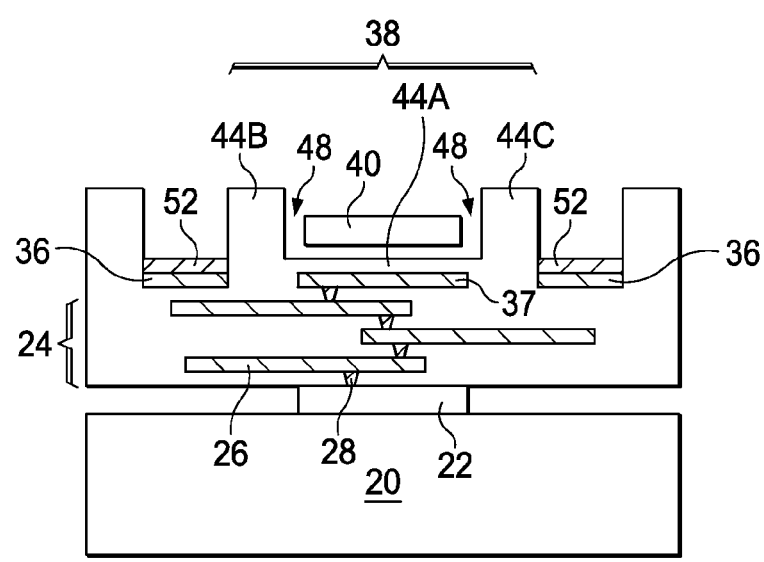

Referring to FIG. 2, metal layer 32 and protection layer 34 are patterned using lithography and etching processes. Bond ring 36 is formed from metal layer 32. Accordingly, bond ring 36 may also be formed of aluminum or aluminum copper, although it may also be formed of other materials. The remaining portions of protection layer 34 are denoted as protection layer(s) 52, which are co-terminus with the underlying bond ring 36. The edges of protection layer 52 are aligned to the respective edge of bond ring 36. Bond ring 36 and protection layer 52 may have a ring shape in a top view of the structure shown in FIG. 2. In some embodiments, besides bond ring 36, there are other metal feature 37 resulted from the same metal layer 32. The portion of protection layer 52 over metal feature 37 may be removed, or may be left un-removed.

Also referring to FIG. 2, MEMS device 38 is formed in the region encircled by bond ring 36. MEMS device 38 may comprise one or a plurality of capacitors, although it may be another kind of MEMS device other than a capacitor. In an exemplary embodiment in which a capacitor(s) is included, MEMS device 38 includes movable element 40 and fixed elements 44 (denoted as 44A, 44B, and 44C). Movable element 40 is also sometimes referred to as a proof mass. In some embodiments, movable element 40 and fixed elements 44 are formed of a silicon-containing material(s) such as polysilicon, amorphous silicon, or crystalline silicon. The silicon-containing material may be doped with a p-type or an n-type impurity to increase the conductivity.

In some embodiments, movable element 40 and fixed elements 44 of MEMS device 38 may be grown from metal layer 24 and the overlying structures, if any. In alternative embodiments, MEMS device 38 may be pre-formed on another wafer, and then bonded to metal layers 24. Fixed elements 44 may include portion 44A, which is under movable element 40 and forms a capacitor with movable element 40. Movable element 40 and fixed elements 44 form capacitor plates of the capacitor(s), while air-gaps 48 between movable element 40 and fixed elements 44 form the capacitor insulators. Furthermore, movable element 40 and other fixed elements such as 44B and/or 44C may form additional capacitors, with air-gaps 48 therebetween forming the capacitor insulators. Although not illustrated, movable element 40 may be anchored and supported by springs (not shown), which may be formed of the same material as that of movable element 40 and/or fixed elements 44. The springs are not in the same plane as illustrated, and hence are not illustrated herein. The springs allow movable element 40 to move freely in air-gaps 48, so that the capacitance of the capacitors formed between movable element 40 and fixed elements 44 may be changed. The capacitor formed between elements 40 and 44A may be used for reflecting the Z-direction movement of movable element, while the capacitor (s) formed between elements 40 and 44B and 44C may be used for reflecting the movement of movable element 40 in the X and Y directions.

Figure 3:
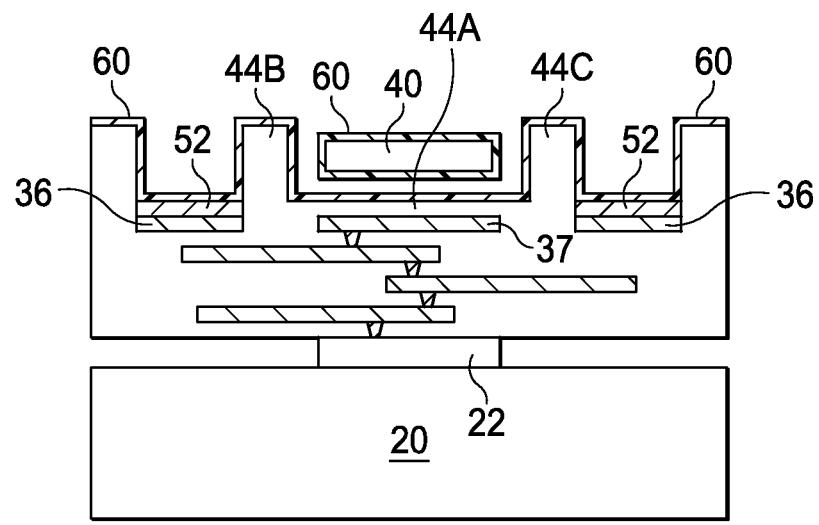

Referring to FIG. 3, anti-stiction coating 60 is formed, for example, using a chemical vapor deposition (CVD) method. Anti-stiction coating 60 is formed on the exposed surfaces of movable element 40, fixed elements 44 (44A/44B/44C), and protection layer 52. In some embodiments, anti-stiction coating 60 comprises an anti-stiction material, which may comprise carbon, silicon, fluoride, chloride, and combinations thereof.

A thermal treatment is performed on the structure shown in FIG. 3. The thermal treatment may be performed at a temperature between about 250° C. and about 450° C. The duration of the thermal treatment may be less than about 60 minutes. The thermal treatment may be performed in a vacuum environment such as a vacuumed chamber. In alternative embodiment, a ultra-violet (UV) treatment may be performed.

Figure 4:
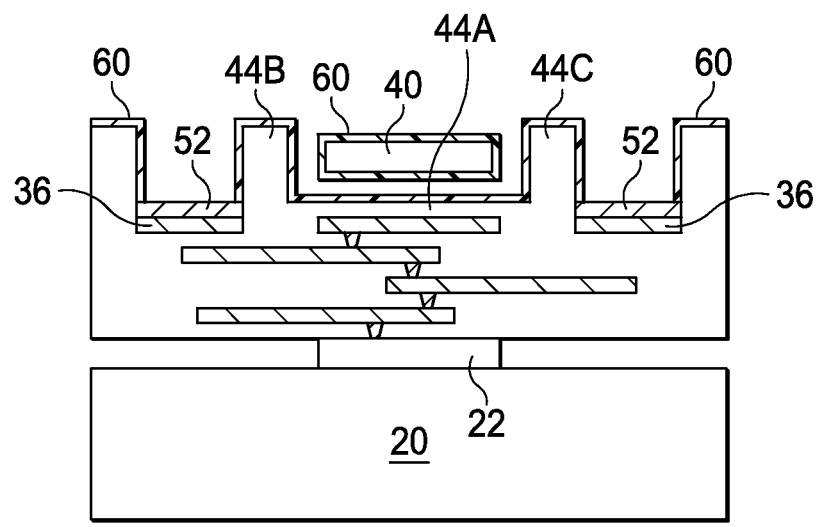

Referring to FIG. 4, a selective removal is also performed, so that the portions of anti-stiction coating 60 on the surfaces of protection layer 52 is removed, while the portions of anti-stiction coating 60 on the surfaces of movable element 40 and fixed elements 44 may remain un-removed.

Before the formation of anti-stiction coating 60, and also after the selective removal, protection layer 52 may be exposed to open air. Protection layer 52 may also form an oxide (not shown) on its surface. However, the oxide is less stable than the oxide of bond ring 36, which is prevented from being formed in the embodiments due to the in-situ formation of protection layer 52. The oxide of protection layer 52 may be easily removed in the subsequent bonding process.

Figure 5:
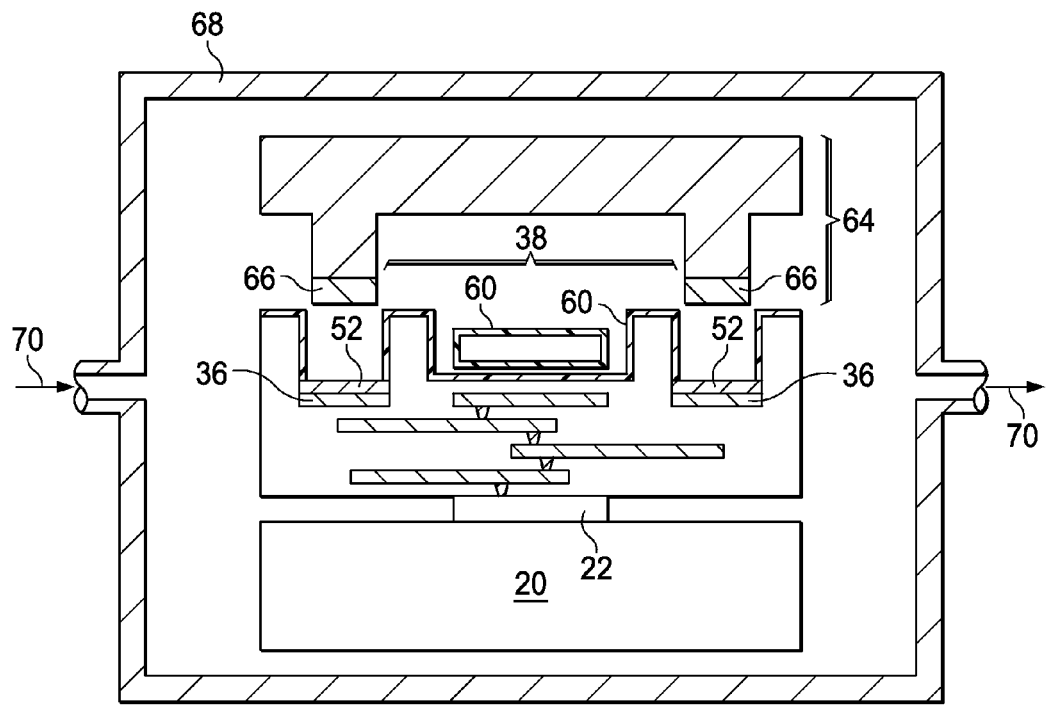
Figure 6:
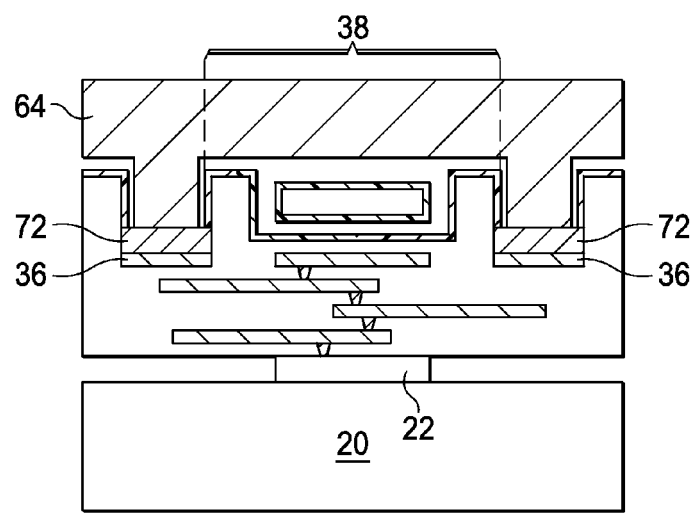
Figure 7:
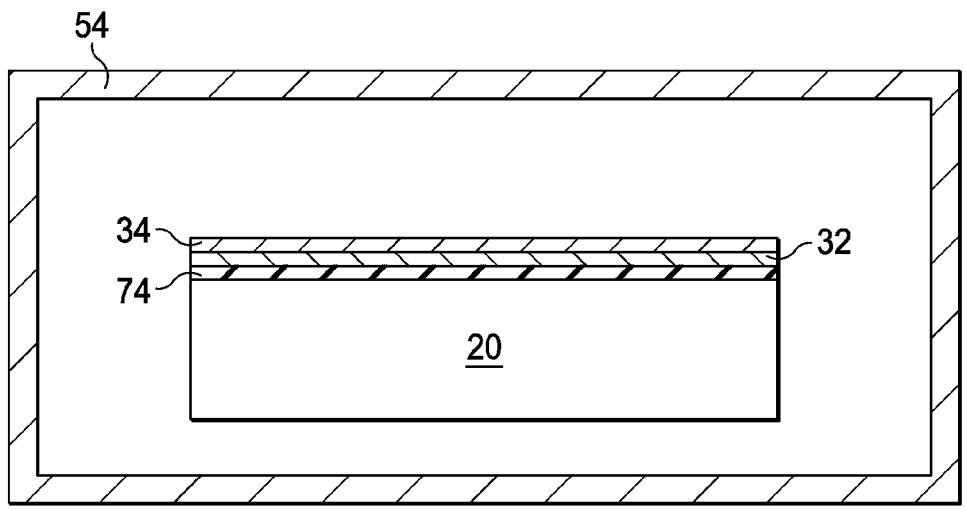
FIGS. 7 through 12 are cross-sectional views of intermediate stages in the manufacturing of a micro-electro-mechanical system (MEMS) device in accordance with various alternative embodiments.

FIG. 5 illustrates the bonding of cap 64 onto the structure shown in FIG. 3. In an embodiment, cap 64 may be formed of a semiconductor material such as silicon, a metal, or a dielectric material. Cap 64 includes a portion over MEMS device 38, with an air-gap between cap 64 and MEMS device 38. Bond layer 66 is formed as a bottom surface portion of cap 64, and will be joined with bond ring 36 and protection layer 52. In a top view, bond layer 66 may have a ring that has a size and a shape matching the top-view size and the shape, respectively, of bond ring 36. In some embodiments, cap 64 may include additional MEMS devices (not shown), CMOS devices (not shown), or the like. In an embodiment, bond layer 66 comprises a material that forms a eutectic alloy with protection layer 52 and bond ring 36. Accordingly, bond layer 66 may comprise germanium, indium, tin, gold, or the like, and may have a single-layered structure or a composite structure.

The bonding of cap 64 to bond ring 36 and protection layer 52 may be performed in chamber 68. During the bonding process, forming gas 70 may be pumped in, and purged from, chamber 68. Forming gas 70 may comprise a reduction gas such as hydrogen ($H_2$) or an acid such as oxalic acid or acetic acid. Accordingly, the oxide of protection layer 52 and bond layer 66 will be removed before and during the bonding process. The bonding process may be performed at a temperature between about 420° C. and about 460° C., for example, when the aluminum and germanium are involved in the bonding. The bonding temperature, depending from the type of the resulting eutectic alloy, may also be higher or lower. During the bonding process, a force may be applied to press cap 64 against bond ring 36 and protection layer 52. FIG. 6 illustrates the resulting structure. At least a top layer of bond ring 36 forms eutectic alloy 72 with protection layer 52 and bond layer 66 as shown in FIG. 5. During the bonding process, protection layer 52, bond layer 66, and at least the top layer of bond ring 36 go through a eutectic reaction, and are liquefied to form eutectic alloy 72 at a high temperature. The liquid is solidified when the temperature is lowered. Eutectic alloy 72 may also have a ring shape in the top view of FIG. 6. Cap 64 is thus joined with bond ring 36.

In the embodiments shown in FIGS. 1 through 6, MEMS devices are formed over substrate 20, with active devices 22 formed thereon. Accordingly, the structure shown in FIG. 6 comprises both active devices 22 and MEMS device 38. In alternative embodiments, no active device is formed on the surface of substrate 20. FIGS. 7 through 12 illustrate the formation process of the respective structure in accordance with various alternative embodiments. Unless specified otherwise, the materials and formation methods of the components in these embodiments are essentially the same as the like components, which are denoted by like reference numerals in the embodiment shown in FIGS. 1 through 6. The formation details of the embodiment shown in FIGS. 7 through 12 may thus be found referring to the discussion of the embodiments shown in FIGS. 1 through 6.

Figure 8:
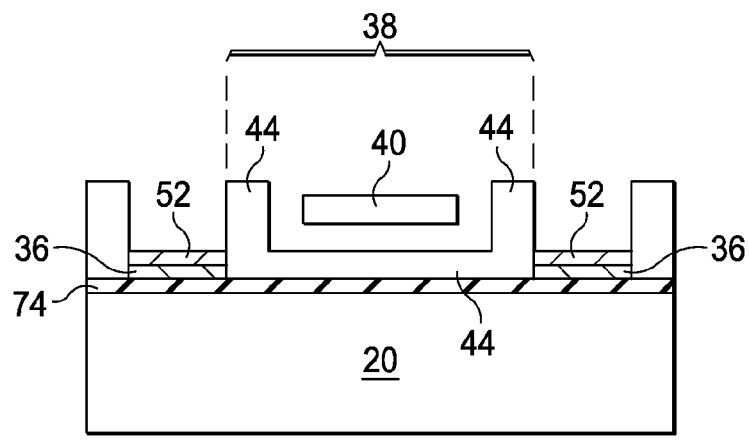
Figure 9:
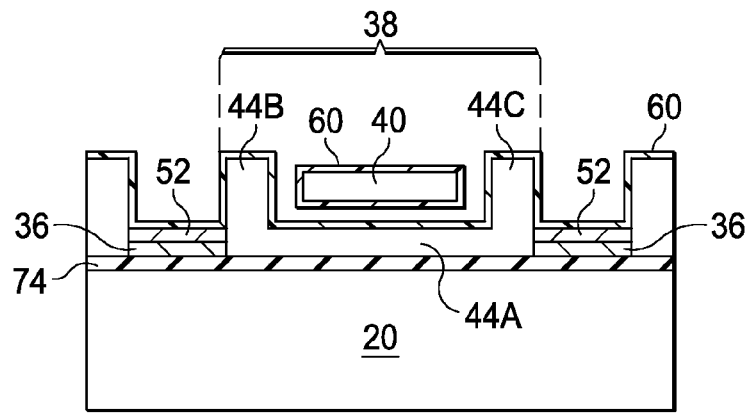
Figure 10:
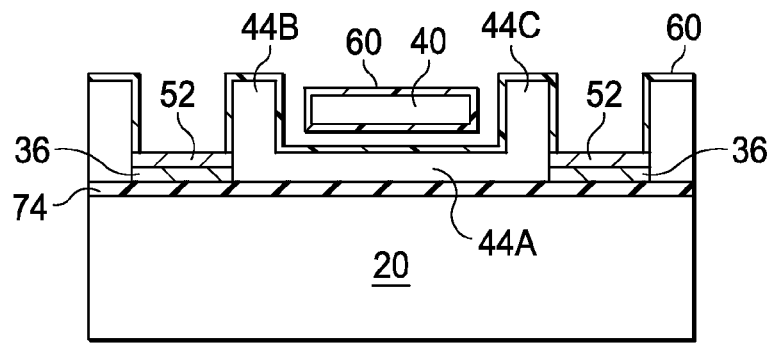
Figure 11:
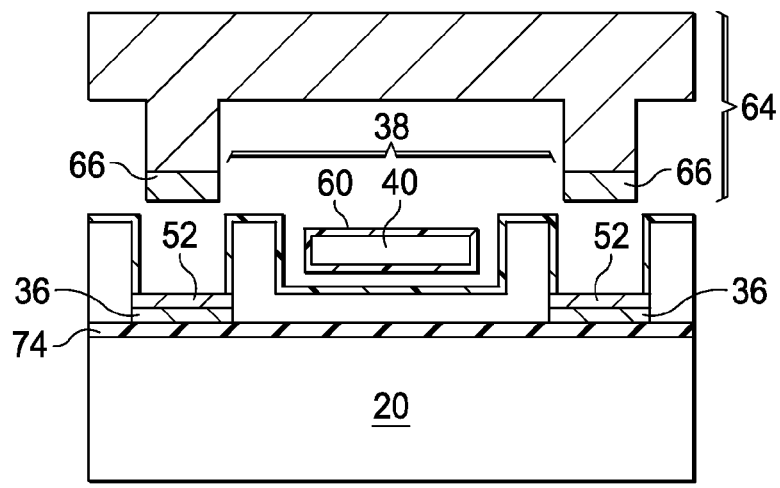
Figure 12:
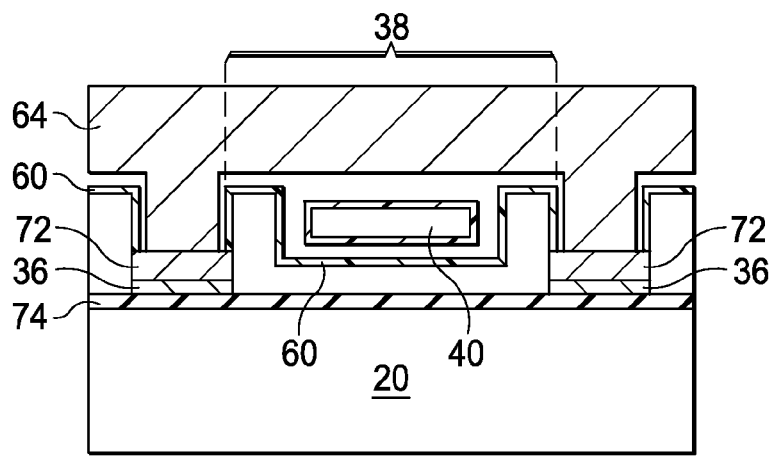

In these embodiments, metal layer 32 may be formed on dielectric layer 74 (FIG. 7), which may be a silicon oxide form, by thermal oxidizing a surface layer of silicon substrate 20. Alternatively, substrate 20 is a dielectric substrate, and bond ring 36 may be formed directly on dielectric substrate 20. The formation process may include the in-situ deposition of metal layer 32 and blanket protection layer 34 (FIG. 7), with no vacuum break between the deposition steps of metal layer 32 and blanket protection layer 34. Furthermore, metal layer 32 and blanket protection layer 34 may be formed in the same process chamber 54, and may be formed using PVD. Metal layer 32 and the blanket protection layer 34 are then patterned using a lithography and etching process, and the resulting structure is illustrated in FIG. 8. FIG. 8 also shows the formation of MEMS device 38. The remaining process steps and the respective materials, including the formation of anti-stiction coating 60 and the bonding of cap 64 through bond layer 66, are shown in FIGS. 9 through 12, and are essentially the same as shown in FIGS. 2 through 5. The process details and the materials may be found by referring to the embodiments shown in FIGS. 1 through 6, and are not repeated herein.

In the embodiments, by in-situ forming bond ring 36 and protection layer 52, protection layer 52 prevents the oxidation of bond ring 36. Accordingly, there is no need to perform an ion bombardment to remove the resulting oxide. The adverse effects of the ion bombardment are thus avoided, which adverse effects include the charging of the movable element and the fixed elements, and in turn the increase in the possibility of the stiction.

In accordance with embodiments, a method includes forming a MEMS device, forming a bond layer adjacent the MEMS device, and forming a protection layer over the bond layer. The steps of forming the bond layer and the protection layer include in-situ deposition of the bond layer and the protection layer.

In accordance with other embodiments, a method includes forming a MEMS device over a substrate. The step of forming the MEMS device includes forming a movable element as a first capacitor plate of a capacitor, and forming a fixed element as a second capacitor plate of the capacitor. The method further includes depositing a metal layer over the substrate in a process chamber, and depositing a protection layer over the metal layer and in the process chamber. Between the step of depositing the metal layer and the step of depositing the protection layer, no vacuum break occurs to the process chamber. The metal layer and the protection layer are patterned to form a bond ring encircling the MEMS device. A cap is bonded to cover the MEMS device, wherein during the step of bonding, the protection layer forms a eutectic alloy with the bond ring in a eutectic reaction.

In accordance with yet other embodiments, a device includes a substrate, and a MEMS device over the substrate. The MEMS device includes a movable element as a first capacitor plate of a capacitor, and a fixed element as a second capacitor plate of the capacitor. A bond ring encircles the MEMS device and comprises a metal. A protection layer is disposed over the bond ring, wherein the protection layer is capable of forming a eutectic metal with the bond ring.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    a micro-electro-mechanical system (MEMS) device over the substrate, wherein the MEMS device comprises:
        a movable element as a first capacitor plate of a capacitor; and
        a fixed element as a second capacitor plate of the capacitor;
    a bond ring encircling the MEMS device, wherein the bond ring comprises a metal; and
    a protection layer over the bond ring, wherein the protection layer is capable of forming a eutectic metal with the bond ring.

2. The device of claim 1, wherein the protection layer is in contact with the bond ring.

3. The device of claim 1, wherein edges of the protection layer are co-terminus with respective edges of the bond ring.

4. The device of claim 1 further comprising a cap comprising a bond layer at a surface, wherein the bond layer comprises a material capable of forming a eutectic alloy with the protection layer and the bond ring, and wherein the cap comprises a ring having substantially a same size as the bond ring.

5. The device of claim 1, wherein the protection layer comprises a material selected from the group consisting essentially of germanium, indium, gold, and combinations thereof, and wherein the bond ring comprises a material selected from the group consisting essentially of aluminum and tin.

6. The device of claim 1, wherein the protection layer is a stacked layer comprising a germanium layer stacked on an aluminum layer.

7. The device of claim 1 further comprising an anti-stiction coating at a surface of the fixed element.

8. The device of claim 7, wherein the anti-stiction coating has an end contacting the protection layer.

9. The device of claim 1 comprising an additional anti-stiction coating at a surface of the movable element.

10. A device comprising:
    a substrate;
    a micro-electro-mechanical system (MEMS) device over the substrate, wherein the MEMS device comprises:
        a movable element as a first capacitor plate of a capacitor; and
        a fixed element as a second capacitor plate of the capacitor;

a bond ring encircling the MEMS device, wherein the bond ring comprises a metal, and wherein the bond ring comprises a first inner edge, and a first outer edge encircling the first inner edge; and a protection layer over the bond ring, wherein the protection layer is capable of forming a eutectic metal with the bond ring, and wherein the protection layer forms a ring with a second inner edge aligned to the first inner edge, and a second outer edge aligned to the first outer edge.

11. The device of claim 10, wherein a bottom surface of the protection layer is in contact with a top surface of the bond ring.

12. The device of claim 10 further comprising a cap comprising a bond layer at a surface, wherein the bond layer comprises a material capable of forming a eutectic alloy with the protection layer, and the cap comprises a ring having substantially a same size as the bond ring.

13. The device of claim 10, wherein the protection layer comprises a material selected from the group consisting essentially of germanium, indium, gold, and combinations thereof, and wherein the bond ring comprises a material selected from the group consisting essentially of aluminum and tin.

14. The device of claim 10, wherein the protection layer is a stacked layer comprising a germanium layer stacked on an aluminum layer.

15. The device of claim 10 further comprising an anti-stiction coating at a surface of the fixed element, wherein the anti-stiction coating covers a first portion of a top surface of the protection layer, and leaving a second portion of the top surface of the protection layer un-covered.

16. The device of claim 15 comprising an additional anti-stiction coating at a surface of the movable element, wherein the anti-stiction coating and the additional anti-stiction coating are formed of a same material.

17. A device comprising:
a substrate;
a micro-electro-mechanical system (MEMS) device over the substrate, wherein the MEMS device comprises:
 a movable element as a first capacitor plate of a capacitor; and
 a fixed element as a second capacitor plate of the capacitor;
a bond ring encircling the MEMS device, wherein the bond ring comprises a metal;
a protection layer over and contacting the bond ring, wherein the protection layer is capable of forming a eutectic metal with the bond ring, and wherein edges of the protection layer are co-terminus with respective edges of the bond ring; and
an anti-stiction layer comprising:
 a first portion covering surfaces of the movable element;
 a second portion covering surfaces of the fixed element; and
 a third portion covering a first portion of a top surface of the protection layer, with a second portion of the top surface of the protection layer un-covered by the anti-stiction layer.

18. The device of claim 17 further comprising a cap comprising a bond layer at a surface, wherein the bond layer comprises a material capable of forming a eutectic alloy with the protection layer, and the cap comprises a ring having substantially a same size as the bond ring.

19. The device of claim 17, wherein the protection layer comprises a material selected from the group consisting essentially of germanium, indium, gold, and combinations thereof, and wherein the bond ring comprises a material selected from the group consisting essentially of aluminum and tin.

20. The device of claim 17, wherein the protection layer is a stacked layer comprising a germanium layer stacked on an aluminum layer.

* * * * *